United States Patent
Chi et al.

(10) Patent No.: US 9,873,944 B2
(45) Date of Patent: Jan. 23, 2018

(54) METAL CAPPING PROCESS AND PROCESSING PLATFORM THEREOF

(71) Applicant: Taiwan Semiconductor Manufacturing CO., LTD., Hsinchu (TW)

(72) Inventors: Chih-Chien Chi, Hsinchu (TW); Szu-Ping Tung, Taipei (TW); Huang-Yi Huang, Hsinchu (TW); Ching-Hua Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/340,108

(22) Filed: Nov. 1, 2016

(65) Prior Publication Data

US 2017/0044668 A1 Feb. 16, 2017

Related U.S. Application Data

(62) Division of application No. 14/155,695, filed on Jan. 15, 2014, now Pat. No. 9,487,864.

(51) Int. Cl.
| | | |
|---|---|---|
| *H01L 39/00* | (2006.01) |
| *C23C 16/50* | (2006.01) |
| *H01L 21/67* | (2006.01) |
| *H01L 21/768* | (2006.01) |
| *H01L 21/02* | (2006.01) |
| *C23C 16/02* | (2006.01) |
| *C23C 16/06* | (2006.01) |
| *C23C 16/44* | (2006.01) |
| *H01L 21/285* | (2006.01) |
| *H01L 21/687* | (2006.01) |
| *H01L 23/522* | (2006.01) |
| *H01L 23/532* | (2006.01) |

(52) U.S. Cl.
CPC .............. *C23C 16/50* (2013.01); *C23C 16/02* (2013.01); *C23C 16/06* (2013.01); *C23C 16/4401* (2013.01); *H01L 21/02074* (2013.01); *H01L 21/28562* (2013.01); *H01L 21/28568* (2013.01); *H01L 21/67184* (2013.01); *H01L 21/67201* (2013.01); *H01L 21/67207* (2013.01); *H01L 21/68707* (2013.01); *H01L 21/76829* (2013.01); *H01L 21/76849* (2013.01); *H01L 21/76883* (2013.01); *H01L 23/5226* (2013.01); *H01L 23/53238* (2013.01); *H01L 21/76834* (2013.01)

(58) Field of Classification Search
CPC ............. H01L 21/768; H01L 21/76895; H01L 21/823475
See application file for complete search history.

(56) References Cited

U.S. PATENT DOCUMENTS

| | | |
|---|---|---|
| 2013/0256888 A1 | 10/2013 | Shih et al. |
| 2014/0256128 A1 | 9/2014 | Spurlin et al. |

*Primary Examiner* — Elias M Ullah

(57) ABSTRACT

Before depositing a metal capping layer on a metal interconnect in a damascene structure, a remote plasma is used to reduce native oxide formed on the metal interconnect. Accordingly, a remote plasma reducing chamber is integrated in a processing platform for depositing a metal capping layer.

20 Claims, 5 Drawing Sheets

METAL CAPPING PROCESS AND PROCESSING PLATFORM THEREOF

PRIORITY CLAIM AND CROSS-REFERENCE

The present application is a Divisional application of the U.S. patent application Ser. No. 14/155,695, filed Jan. 15, 2014, the entire contents of which are hereby incorporated herein by reference.

BACKGROUND

As the copper interconnect dimension is continuously scaled down, the current density of the copper interconnect is continuously increased. Therefore, electromigration problem of copper interconnect is enhanced, and risk of failure is thus increased. Accordingly, in a damascene process, a metal capping layer on the copper interconnect is needed to slow the copper diffusion to enhance the electromigration resistance of the copper interconnect.

DETAILED DESCRIPTION

Figure 1:
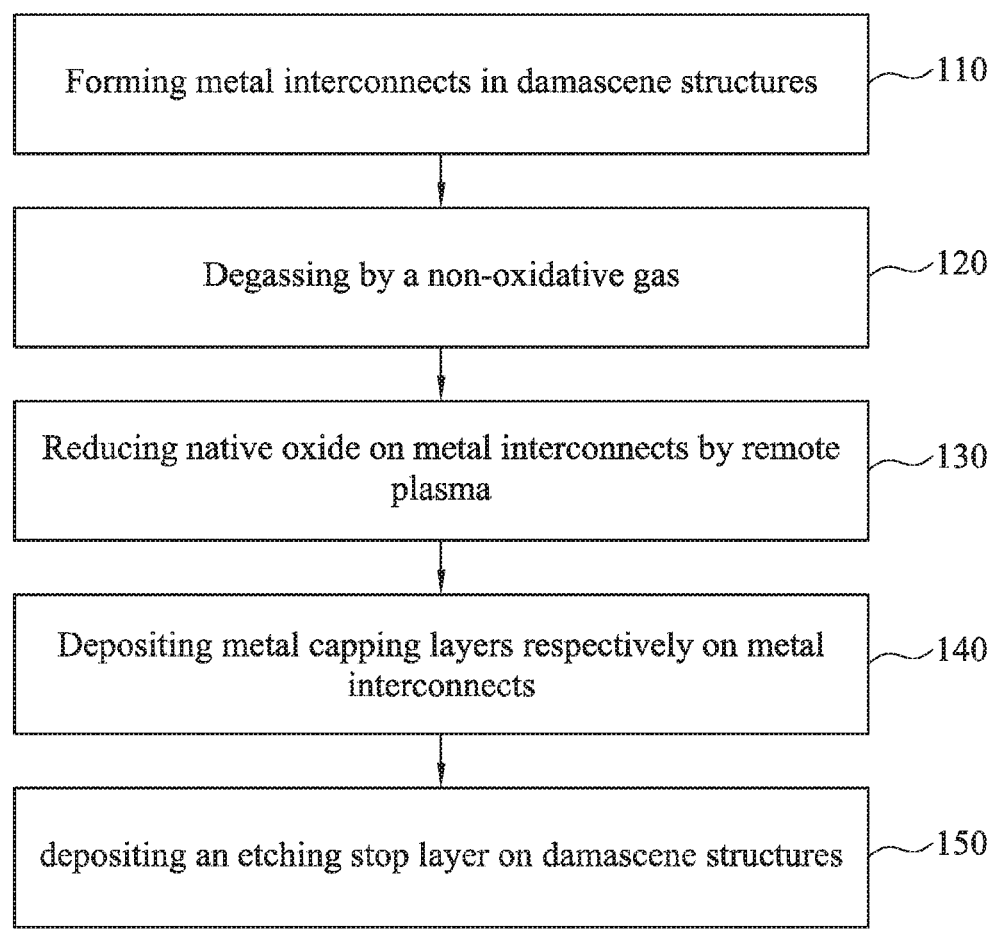
FIG. 1 is a flowchart showing a process flow of depositing a metal capping layer according to some embodiments of this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Since copper can be easily oxidized by air, a native oxide layer is usually formed by oxidizing the exposed surface of copper interconnects. The resistance of the native oxide layer is much higher than the resistance of the pure copper or the fresh copper. Therefore, the resistance of the copper interconnects, especially the contact resistance between the copper interconnect and a metal capping layer, is usually increased by the native oxide formed on the exposed surface of the copper interconnects.

Conventionally, the processing platform designed for depositing the metal capping layer uses only a degassing chamber purged with hydrogen or argon to desorb the gases adsorbing on the surface of a wafer, and thus decrease the thickness of the native oxide layer. However, the contact sheet resistance between the metal capping layer and the copper interconnects is still quite high. Therefore, a new process of depositing a metal capping layer and a new design of the processing platform for depositing the metal capping layer are provided in this disclosure.

According to some embodiments, a method of forming a metal capping layer on a metal interconnect is provided. FIG. 1 is a flowchart showing a process flow of depositing a metal capping layer according to some embodiments of this disclosure, and FIGS. 2A-2D are cross-sectional diagrams showing the process of depositing a metal capping layer in FIG. 1. FIGS. 1 and 2A-2C are referred below at the same time.

In forming step 110 of FIG. 1, metal interconnects are formed in damascene structures. For example, in FIG. 2A, damascene openings 215 are first formed in a low-k dielectric layer 210 on a wafer 200. Then, barrier layers 220 are formed respectively on inner surface of the damascene openings 215. Next, metal interconnects 230 fill the damascene openings 215, and the metal interconnects 230 can be a copper interconnects, for example. Since metal interconnects 230 can be instantly oxidized once exposed in air, native oxide layers 240 are formed respectively on the exposed surface of the metal interconnects 230.

Degassing step 120 in FIG. 1 is an optional step. In degassing step 120, the wafer with the damascene structure and the metal interconnects is degassed under a low pressure of a non-oxidative gas and at a temperature of 200-400° C. to remove gas adsorbed on wafer's surface. The non-oxidative gas can be argon or hydrogen, and the low pressure above can be $10^{-3}$-$10^{-8}$ Torr, such as $10^{-5}$ Torr, for example.

Figure 2A:
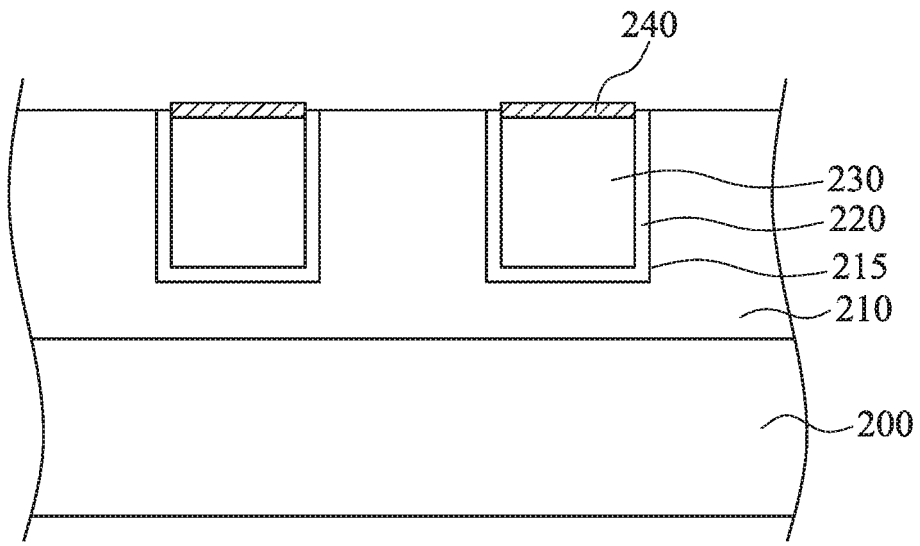
FIGS. 2A-2D are cross-sectional diagrams showing the process of depositing a metal capping layer in FIG. 1.
Figure 2B:
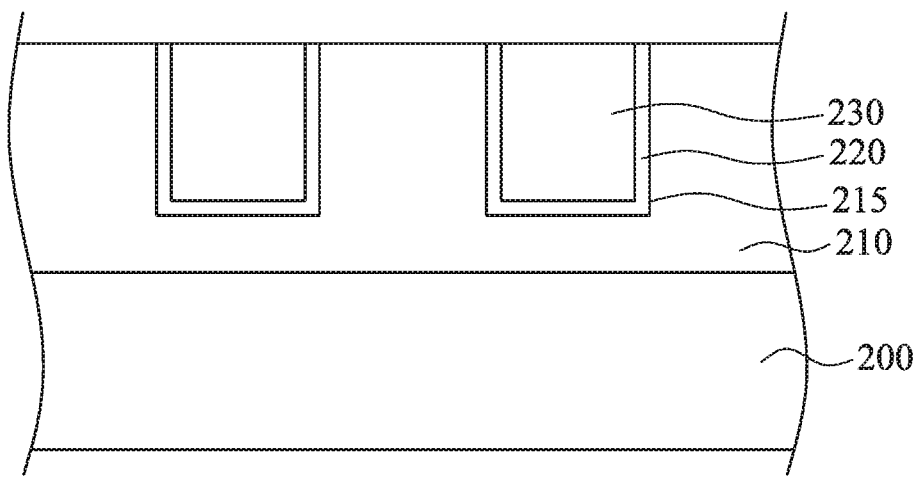

In reducing step 130 of FIG. 1, remote plasma is used to reduce the native oxide layers 240 in FIG. 2A to obtain pure copper interconnects 230 in the structure shown in FIG. 2B. The source gas of the remote plasma is a reducing gas containing hydrogen. The reducing gas can be hydrogen or ammonium, for example. Furthermore, the reducing gas can be mixed with an inert gas, such as helium or argon, for easier ignition of plasma. According some embodiments, the plasma density of the remote plasma is $10^6$-$10^{13}$ cm$^{-3}$, such as $10^8$-$10^{12}$ cm$^{-3}$.

Some related parameters of the remote plasma reducing step 130 are described below. According to some other embodiments, this reducing step 130 can be performed at a pressure of 10-1000 mTorr, such as 200-500 mTorr. According to yet some other embodiments, this reducing step 130 can be performed at a temperate of 25-400° C., such as 300-350° C. According to yet some other embodiments, the reducing step 130 can be performed for 10 seconds to 10 minutes, such as 20 seconds to 2 minutes.

Figure 2C:
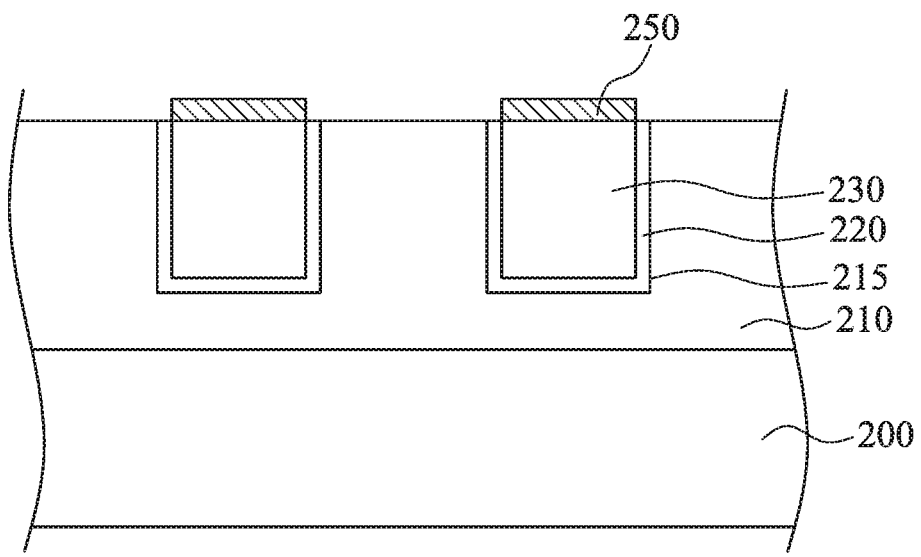

In depositing step 140 of FIG. 1 and FIG. 2C, metal capping layers 250 are next deposited respectively on metal interconnects 230. The metal capping layers 250 can be cobalt layers, for example. The metal capping layers 250 can be formed on the exposed surface of the metal interconnects 230 by selective chemical vapor deposition, for example. Since the native oxide layers 240 are reduced to pure copper, the quality of the metal capping layer 250 and the adhesion strength of the metal capping layer 250 to the metal interconnects 230 can be greatly increased. Thus, the contact resistance between the metal capping layer 250 and the metal interconnects 230 is also greatly decreased.

Figure 2D:
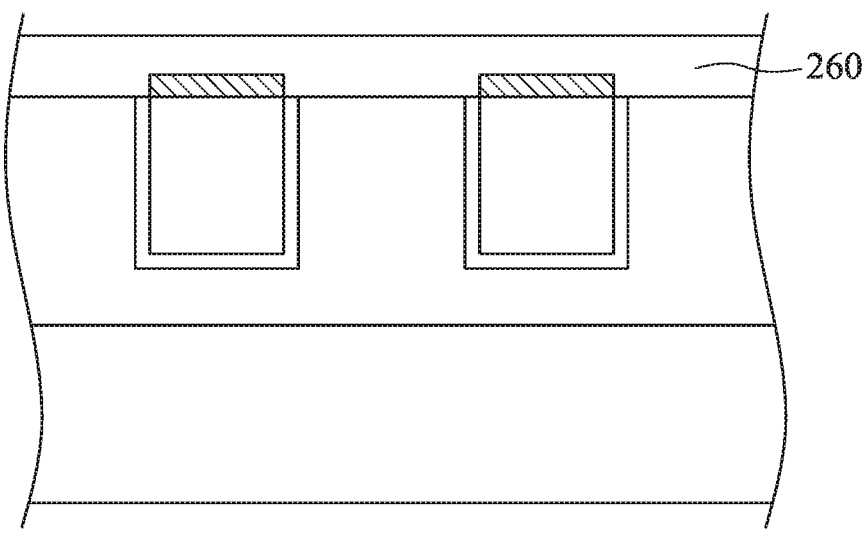

In depositing step 150 of FIG. 1 and FIG. 2D, an etching stop layer 260 is deposited on damascene structures, i.e. the metal capping layer 250, the copper interconnects 230, the barrier layer 220, and the low-k dielectric layer 210 shown in FIG. 2C. The structure shown in FIG. 2D is ready for the next damascene process.

Figure 3:
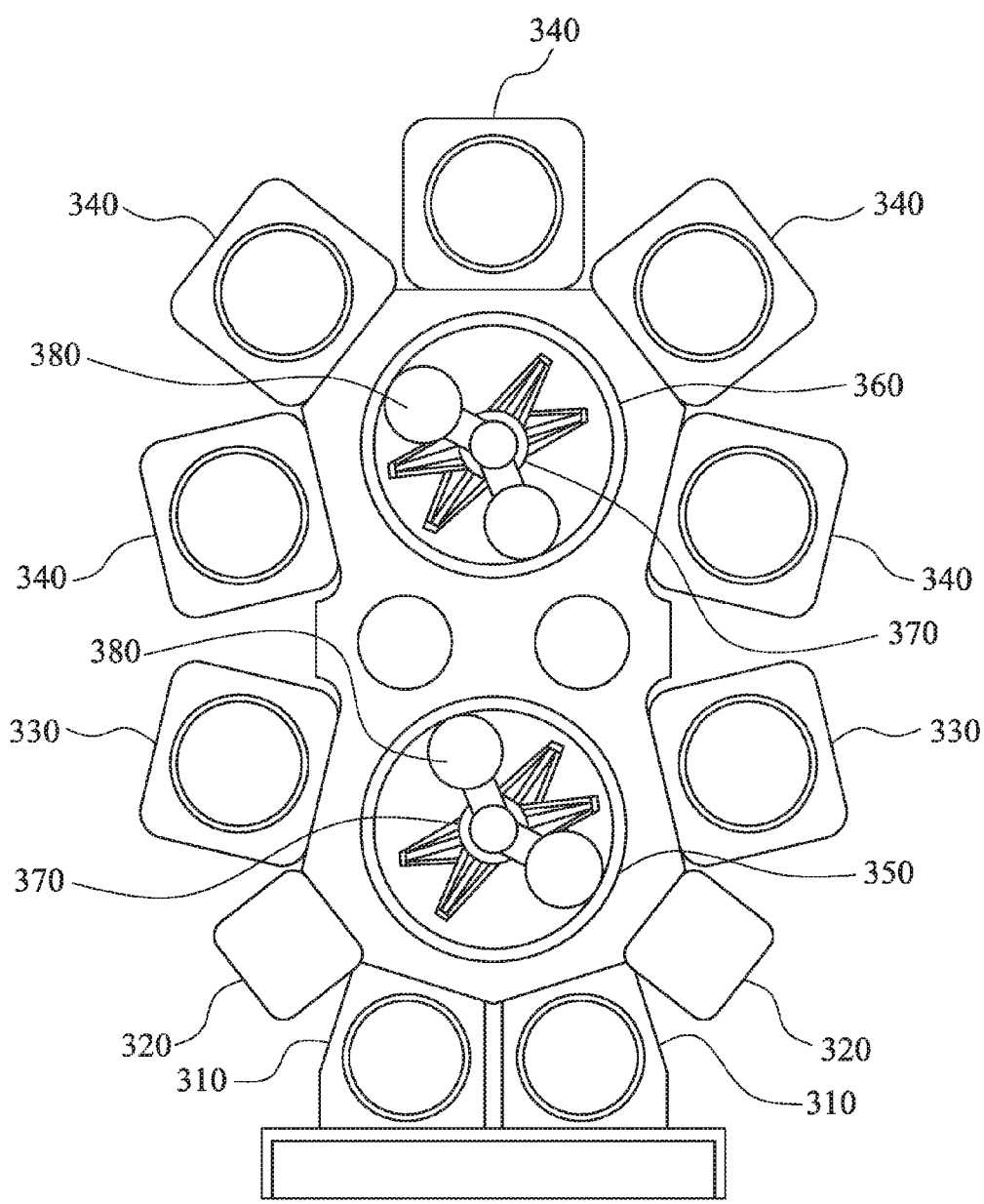
FIG. 3 is a diagram of a processing platform for metal capping process according to some embodiments of this disclosure.

According to some other embodiments, a processing platform for performing a process of depositing a metal capping layer is provided. FIG. 3 is a diagram of a processing platform for metal capping process according to some embodiments of this disclosure. In FIG. 3, the processing platform 300 has a load lock chamber 310, a degassing chamber 320, a remote plasma reducing chamber 330, a deposition chamber 340, a transfer chamber 350, and a buffer chamber 360.

The load lock chamber 310 is used to facilitate transfer of a wafer between a vacuum environment of the transfer chamber 350 and an ambient environment outside the processing platform 310. The degassing chamber 320 is used to performing the degassing step 120 above. The remote plasma reducing chamber 330 is used to performing the reducing step 130 above. The deposition chamber 340 is used to performing the deposing step 140 above. The transfer chamber 350 and the buffer chamber 360 both are connected with several processing chambers above, and thus equipped with a robot 370 for transferring wafer 380 between different processing chambers described above.

Figure 4:
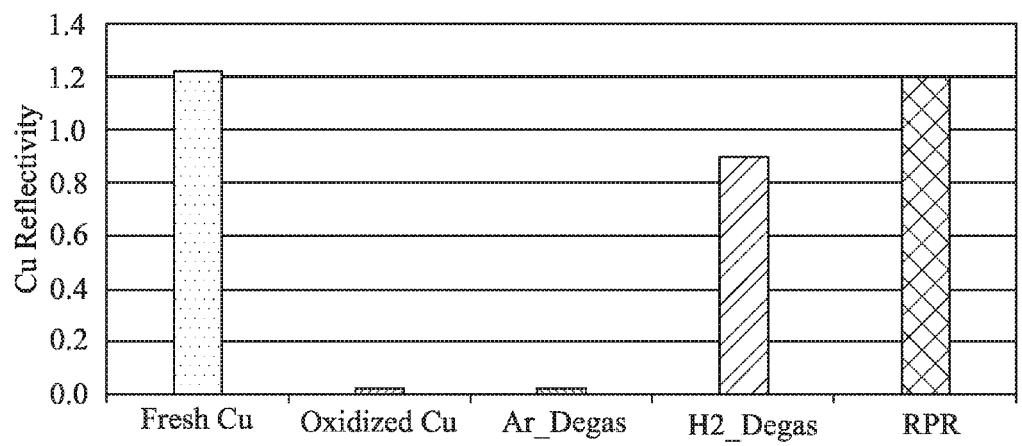
FIG. 4 shows Cu reflectivity measurement results of copper metal treated by various methods.

Some comparison tests were made below to check the quality of the metal interconnect structure. The results are shown and discussed below. FIG. 4 shows Cu reflectivity measurement results of copper metal treated by various methods. The higher the copper reflectivity was, the less the native oxide was located on the exposed surface of the copper metal. In FIG. 4, the reflectivity of fresh Cu sample was measured to be 1.21, and the surface-oxidized copper sample was measured to be 0.02.

The surface-oxidized copper metal samples were respectively treated by argon degassing, hydrogen degassing, and remote plasma reducing (labeled by RPR in FIG. 4). From the results shown in FIG. 4, it can be known that the reducing power of the remote plasma reducing is the strongest. Since the measured copper reflectivity of the sample treated by remote plasma reducing was 1.20, which is almost equal to the fresh Cu sample. Therefore, it can be known that the surface-oxidized copper metal can be almost completely reduced to pure copper metal by the remote plasma reducing method. As for the other two treatment methods, the reducing power of the argon degassing is the weakest.

Figure 5:
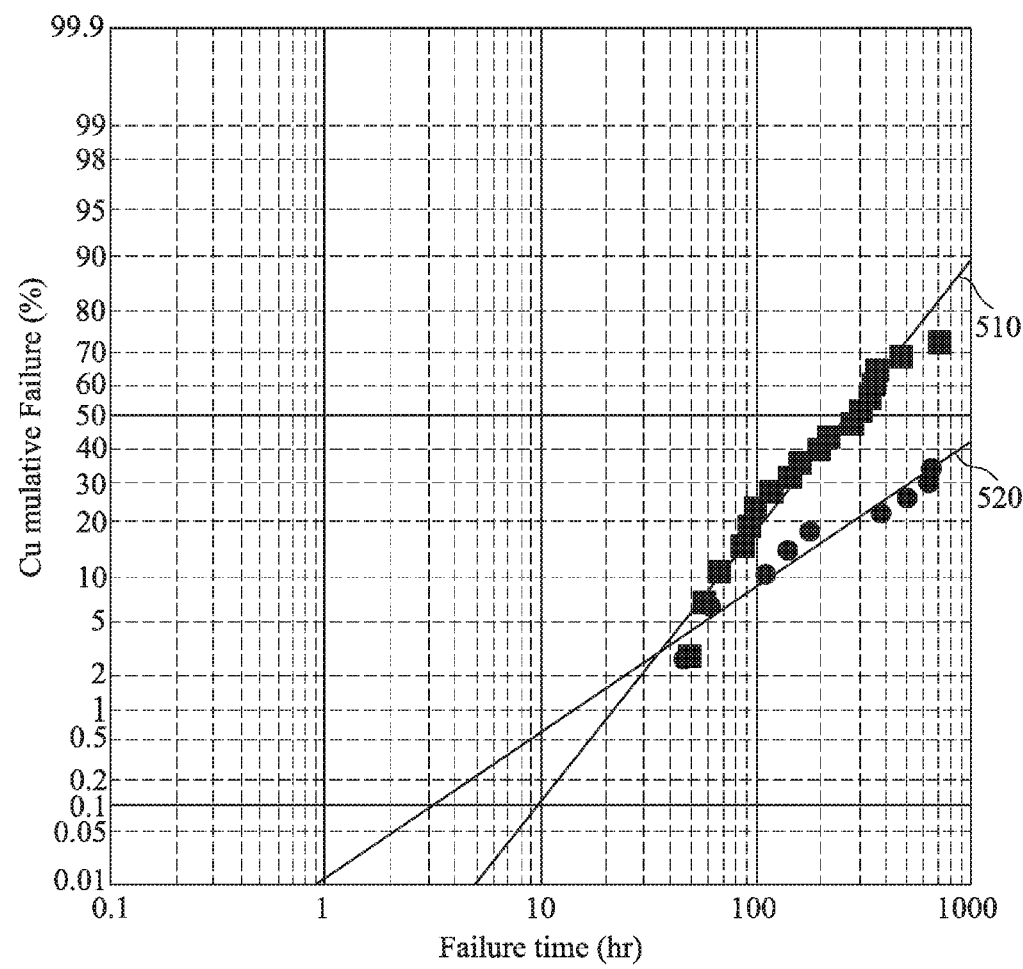
FIG. 5 shows results of cumulative failure of two chip samples, where the copper interconnects were respectively treated by argon degassing (solid square) and hydrogen degassing (solid circle).

FIG. 5 shows results of cumulative failure of two chip samples, where the copper interconnects were respectively treated by argon degassing (solid square) and hydrogen degassing (solid circle). In FIG. 5, the slope of the regression curve 510 for the argon degassing data was slightly greater than the slope of the regression curve 520 for the hydrogen degassing data. This means that the quality of the chips treated by the argon degassing is slightly more uniform. As for the quality of the chips treated by hydrogen degassing, failure points was reduced from about 19 points to 9 points after 600 hours treatment. Therefore, only a part of the surface-oxidized copper metal can be reduced by hydrogen degassing, the quality of the chips is less uniform. In addition, $t_{0.1}$ (i.e. the failure time when the accumulative failure equals to 0.1%) of the regression curve 510 for the argon degassing data was slightly longer than the $t_{0.1}$ of the regression curve 520 for the hydrogen degassing data. This means that the chip treated by argon degassing began to fail at a slightly later time.

However, there is no data of the chip containing copper interconnects treated by remote plasma reducing, because no failures occurred for at least 600 hours. This result shows that remote plasma reducing-treated chip was much more reliable than the argon degassing- and the hydrogen degassing-treated chips.

Accordingly, a method of forming a metal capping layer on a metal interconnect is provided in some embodiments. A native oxide layer on a copper interconnect in a damascene structure on a substrate is reduced by a remote plasma generated by a reducing gas containing hydrogen. A cobalt layer is formed on the copper interconnect to be a metal capping layer after removing the cooper oxide layer.

In some other embodiments, a method of forming a metal capping layer on metal interconnects is provided. A native oxide formed on metal interconnects on a wafer is reduced by a remote plasma in a remote plasma reducing chamber of a processing platform. A metal capping layer is formed on the reduced metal interconnects in a chemical vapor deposition chamber of the processing platform.

In some other embodiments, a processing platform for metal capping process is provided. The processing platform includes a transfer chamber, a load lock chamber, a remote plasma reducing chamber, and a deposition chamber. The transfer chamber is equipped with a robot for transferring a wafer. The load lock chamber is used for facilitating transfer of the wafer between a vacuum environment of the transfer chamber and an ambient environment outside the processing platform. The remote plasma reducing chamber is connected to the transfer chamber, wherein the remote plasma reducing chamber is used for reducing native oxide on metal interconnects on the wafer. The deposition chamber is connected to the transfer chamber, wherein the deposition chamber is used for depositing metal capping layers respectively on the reduced metal interconnects.

Therefore, a method of forming a metal capping layer on a metal interconnect and a processing platform for forming a metal capping layer on a metal interconnect are provided in this disclosure. The native oxide on metal interconnects treated by remote plasma reducing method can be almost completely reduced. Hence, the contact resistance between the metal interconnects and the metal capping layer can be effectively reduced to obtain a much more reliable integrated circuit product.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A processing platform for metal capping process, comprising:
   a transfer chamber equipped with a robot for transferring a wafer;
   a load lock chamber for facilitating transfer of the wafer between a vacuum environment of the transfer chamber and an ambient environment outside the processing platform;
   a remote plasma reducing chamber connected to the transfer chamber, wherein the remote plasma reducing chamber is used for reducing native oxide on metal interconnects on the wafer;
   a deposition chamber connected to the transfer chamber for depositing metal capping layers respectively on the reduced metal interconnects; and
   an argon degassing chamber or a hydrogen degassing chamber connected to the transfer chamber, wherein the argon degassing chamber or the hydrogen degassing chamber is used to remove gas adsorbed on the wafer.

2. The processing platform of claim 1, wherein the remote plasma reducing chamber is a remote hydrogen plasma reducing chamber or a remote ammonium plasma reducing chamber.

3. The processing platform of claim 1, wherein the deposition chamber is a metal layer deposition chamber.

4. The processing platform of claim 3, wherein the metal layer deposition chamber is a cobalt layer deposition chamber.

5. The processing platform of claim 1, further comprising a buffer chamber connected to the deposition chamber.

6. A processing platform for metal capping process, comprising:
- a transfer chamber;
- a degassing chamber connected to the transfer chamber;
- a remote plasma reducing chamber connected to the transfer chamber; and
- a deposition chamber connected to the transfer chamber, wherein the remote plasma reducing chamber is arranged between the degassing chamber and the deposition chamber.

7. The processing platform of claim 6, further comprising a load lock chamber connected to the transfer chamber.

8. The processing platform of claim 7, wherein the degassing chamber is arranged between the load lock chamber and the remote plasma reducing chamber.

9. The processing platform of claim 6, wherein the degassing chamber is an argon degassing chamber or a hydrogen degassing chamber.

10. The processing platform of claim 6, wherein the remote plasma reducing chamber is a remote hydrogen plasma reducing chamber or a remote ammonium plasma reducing chamber.

11. The processing platform of claim 6, wherein the deposition chamber is a metal layer deposition chamber.

12. The processing platform of claim 11, wherein the metal layer deposition chamber is a cobalt layer deposition chamber.

13. The processing platform of claim 6, further comprising a robot, wherein the transfer chamber is equipped with the robot.

14. The processing platform of claim 6, further comprising a buffer chamber connected to the deposition chamber.

15. A processing platform for metal capping process, comprising:
- a transfer chamber;
- a degassing chamber connected to the transfer chamber, wherein the degassing chamber is an argon degassing chamber or a hydrogen degassing chamber;
- a remote plasma reducing chamber connected to the transfer chamber;
- a metal layer deposition chamber connected to the transfer chamber; and
- a load lock chamber connected to the transfer chamber, wherein the degassing chamber is arranged between the load lock chamber and the remote plasma reducing chamber.

16. The processing platform of claim 15, wherein the remote plasma reducing chamber is arranged between the degassing chamber and the metal layer deposition chamber.

17. The processing platform of claim 15, wherein the remote plasma reducing chamber is a remote hydrogen plasma reducing chamber or a remote ammonium plasma reducing chamber.

18. The processing platform of claim 15, further comprising a robot, wherein the transfer chamber is equipped with the robot.

19. The processing platform of claim 15, further comprising a buffer chamber connected to the metal layer deposition chamber.

20. The processing platform of claim 15, wherein the metal layer deposition chamber is a cobalt layer deposition chamber.

* * * * *